United States Patent [19]

Stewart

[11] 4,025,410
[45] May 24, 1977

[54] SPUTTERING APPARATUS AND METHODS USING A MAGNETIC FIELD

[75] Inventor: William W. Stewart, Allentown, Pa.

[73] Assignee: Western Electric Company, Inc., New York, N.Y.

[22] Filed: Aug. 25, 1975

[21] Appl. No.: 607,536

[52] U.S. Cl. .............................. 204/192 R; 204/298
[51] Int. Cl.² ......................................... C23C 15/00
[58] Field of Search .......................... 204/192, 298

[56] References Cited

UNITED STATES PATENTS

| | | | |
|---|---|---|---|
| 2,146,025 | 2/1939 | Penning | 204/192 |
| 2,636,855 | 4/1953 | Schwarz | 204/192 |
| 3,170,810 | 2/1965 | Kagan | 117/38 |
| 3,282,815 | 11/1966 | Kay et al. | 204/192 |
| 3,282,816 | 11/1966 | Kay | 204/192 |
| 3,330,752 | 7/1967 | Hallen et al. | 204/192 |
| 3,616,450 | 10/1971 | Clarke | 204/192 |
| 3,669,860 | 6/1972 | Knowles et al. | 204/192 |
| 3,669,861 | 6/1972 | Cash, Jr. et al. | 204/192 |
| 3,711,398 | 1/1973 | Clarke | 204/298 |
| 3,878,079 | 4/1975 | Schauer | 204/192 |
| 3,878,085 | 4/1975 | Corbani | 204/298 |
| 3,897,325 | 7/1975 | Aoshima et al. | 204/298 |

FOREIGN PATENTS OR APPLICATIONS

| | | | |
|---|---|---|---|
| 1,358,411 | 7/1974 | United Kingdom | 204/192 |
| 207,365 | 12/1967 | U.S.S.R. | 204/192 |

OTHER PUBLICATIONS

R. K. Waits, "Sputtering", Electronic Packaging and Production, July 1973, vol. 13, No. 7, pp. 24–30.
E. Kay "Magnetic Field Effects on an Abnormal Truncated Glow Discharge and Their Relation to Sputtered Thin-Film Growth," J. Appl. Phys, vol. 34, pp. 760–768 (1963).

Primary Examiner—John H. Mack
Assistant Examiner—Aaron Weisstuch
Attorney, Agent, or Firm—W. O. Schellin

[57] ABSTRACT

The operation of a sputtering apparatus is improved by selectively enhancing the sputtering on portions of a cathodic target located across from a peripheral area of a workholder. Such enhancement is produced by a magnetic field having flux lines extending substantially parallel to the target into a peripheral segment of a space between the target and the workholder. Relative motion between the magnetic field and the workholder uniformly distributes the effect of the increase in sputtering over the entire periphery of the workholder.

3 Claims, 3 Drawing Figures

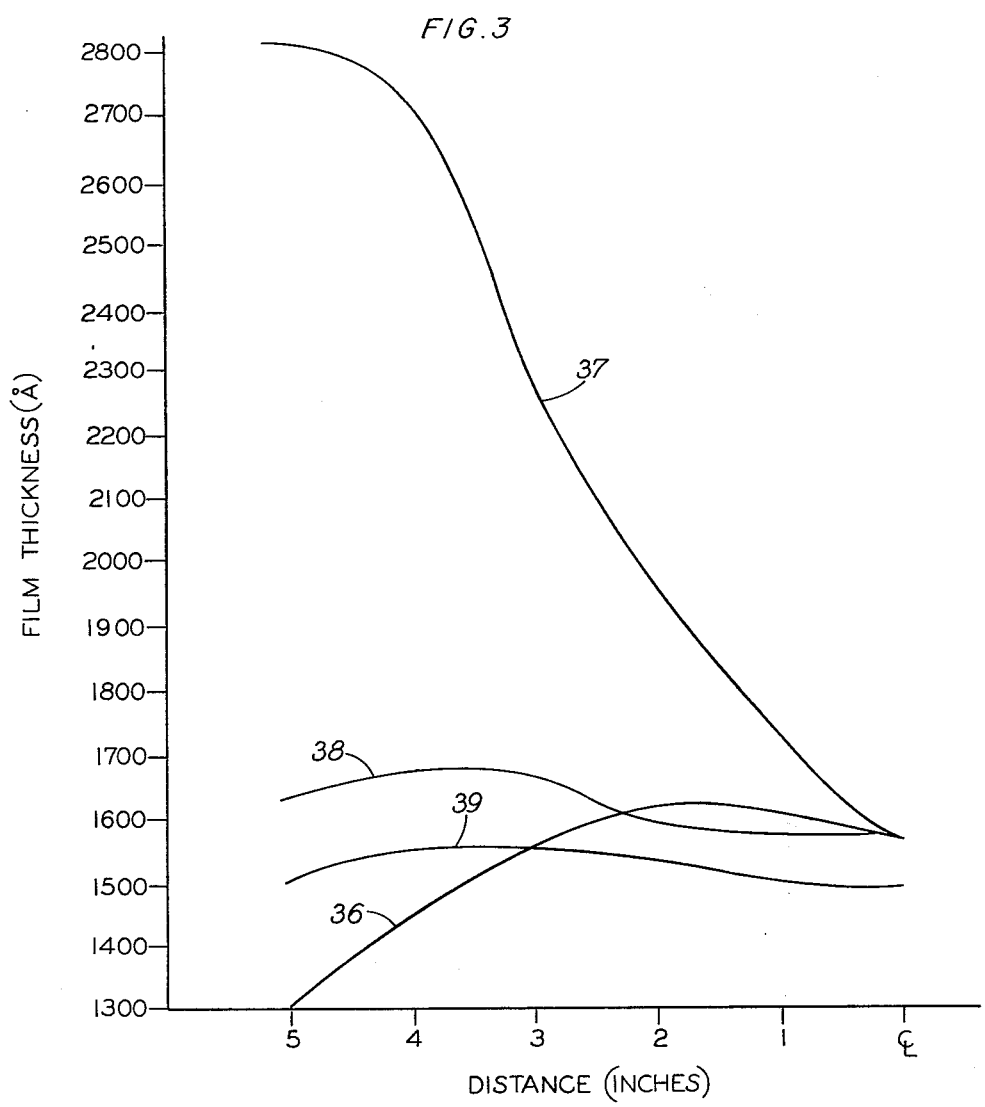

SPUTTERING APPARATUS AND METHODS USING A MAGNETIC FIELD

BACKGROUND OF THE INVENTION

1. Field of the Invention

This invention relates generally to sputtering apparatus using a magnetic field. In particular, this invention is applicable to sputtering operations wherein the geometrical relationship of workpiece positions to a cathode results in some of the workpieces becoming coated with different thicknesses of material than others. The present invention is advantageous where nonuniformity in the thicknesses of material deposition between workpieces of the same lot are not desirable.

2. Discussion of the Prior Art

Sputtering methods to deposit material on substrates are commonly used in the electronics or semiconductor industry where thin metal coatings or films are formed on substrates or semiconductor devices as part of processes for producing conductive contacts and interconnections. For example, uniform metal films may be deposited over the entire surfaces of semiconductor wafers of arrayed, partially finished integrated-circuit devices. Later the surfaces are selectively masked and etched to form contact patterns for these devices.

A suitable type of commercial sputtering apparatus for depositing films of material on articles such as semiconductor wafers employs an evacuable enclosure or chamber. Within the chamber a circular cathode, commonly referred to as the target, is located. An anode is located in a parallel, spaced relationship to the target. A workholder or pallet is mounted to the anode facing the target. The pallet holds a predetermined number of workpieces, or in the case of semiconductor devices, wafers. The number of wafers placed onto the pallet for each cycle of operation corresponds to the largest number of wafers which can be processed by the apparatus in a single batch or lot.

It is, of course, desirable in sputtering films onto the wafers that the thickness of the film on anyone of the wafers is substantially equal to that of the film of any other of the wafers. Rotating the anode with the pallet and wafers thereon during sputtering along an axis perpendicular to the plane of the anode and the target tends to smoothen out variations in thickness relating to angular differences in the sputtering action of the apparatus.

However, it is known that the rate of material deposition tends to diminish toward the outer perimeter of the pallet. Such a decrease in material deposition at the periphery of the pallet is logically explainable. While a circular area opposite a centrally located point on the pallet falls fully on the target, a similarly circular area opposite a point on the periphery of the pallet lies partially outside the periphery of the target. Consequently, a peripheral point on the pallet tends to have less exposure to material eroding from the target.

To minimize nonuniformity of sputtered films caused by such decreased material deposition in peripheral areas, prior art sputtering techniques involve the use of targets which are larger in area than the corresponding pallets. However, for any given apparatus, the size of the target is limited, and such a limitation necessitates a corresponding reduction in the size of the pallet. The size of the pallet on the surface of which a desirable uniformity of material deposition can be achieved, therefore, tends to be dictated by the size of the target.

SUMMARY OF THE INVENTION

It is, therefore, an object of this invention to provide improved sputtering apparatus and methods wherein the uniformity of the deposited film thickness over a selected area is increased.

It is another object of this invention to increase the number of wafers onto which a film of substantially the same thickness can be sputtered in a single sputtering cycle of a given apparatus.

In accordance with the invention, the uniformity of sputtered material deposition is increased in a workholder area facing a substantially circular cathode by a magnetic field which passes substantially laterally through at least one peripheral segment of the space between the cathode and the workholder. The magnetic field increases erosion in, and deposition on, respective adjacent cathode and workholder surfaces. The increase of the depositing material on a portion of the workholder contiguous to the segment is distributed about the periphery of the workholder by a relative rotation of the workholder with respect to the magnetic field, exposing the periphery of the workholder substantially equally to the segment of the magnetic field.

DESCRIPTION OF THE DRAWINGS

The present invention is best undestood from the detailed description below when read in conjunction with the appended drawing, wherein:

FIG. 3 is a diagram showing radial variation in the thickness of deposited film materials under various conditions.

DETAILED DESCRIPTION

1. Operation of the Apparatus

Figure 1:
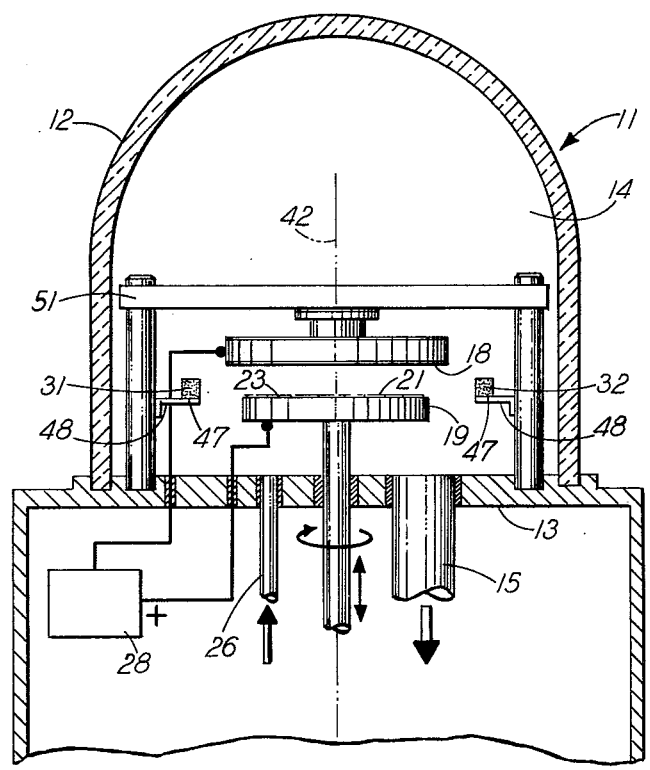
FIG. 1 is a sectional schematic of a sputtering apparatus including an improvement in accordance with the present invention.

Referring now to FIG. 1, there is shown a simplified schematic representation of a batch-process sputtering apparatus, which is generally referred to by the numeral 11. The apparatus includes an enclosure 12 which forms with a base 13 an evacuable chamber 14. Evacuation of the chamber 14 is accomplished through a vacuum port 15 which connects the base 13 with vacuum-drawing equipment, not shown.

Within the chamber 14 a cathode or target 18 is located substantially parallel to and opposite an anode 19. For many applications it is preferred to position the target 18 physically above and centered with respect to the anode 19. Positioning the target 18 above the anode 19 facilitates loading and holding a plurality of semiconductive wafers 21 in the apparatus 11. The operation will be further described with respect to sputtering metallic films onto such semiconductor wafers 21.

Various types of materials which are readily sputterable are well-known in the art and literature is available describing sputter rates of metals and various conductive or nonconductive compounds. Usually sputtering is limited to removing and depositing thin films of material, and their thicknesses are usually specified in angstroms.

The specific embodiment described hereinafter has been applied primarily to sputter metals such as titanium and platinum and compounds such as silicon dioxide and titanium nitride. Thicknesses to which these materials are sputtered range typically from a reverse-sputter or sputter-etching operation of 100 angstroms of silicon dioxide to a sputter deposition in the range of 1600 angstroms of platinum.

Figure 2:
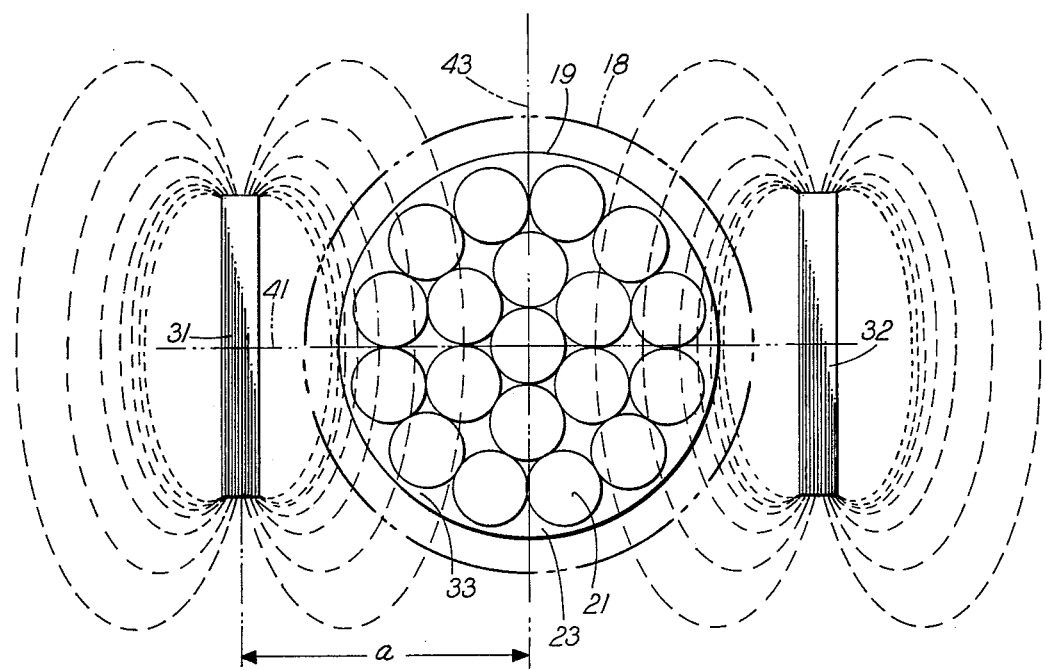
FIG. 2 is a top view of a portion of the apparatus shown in FIG. 1 indicating magnetic field lines of bar magnets disposed parallel to and adjacent the cathode and anode of the apparatus.

In setting up the apparatus 11 for a sputtering cycle, the wafers 21 are loaded onto a workholder or pallet 23 outside of the apparatus. The pallet 23 is then placed into a load lock (not shown) which permits indirect access to the chamber 14 without a need for flooding the chamber with atmospheric air and then having to re-evacuate it. These locks are commonly employed by commercially available apparatus for loading vacuum chambers. A typical load arrangement of the wafers 21 on the pallet 23 is shown in FIG. 2. Once the pallet 23 has been loaded into the lock, the lock is evacuated and the pallet is transferred from the lock to the anode 19. The anode 19 is vertically movable to facilitate this transfer. After having been transferred to the anode 19, the pallet 23 and the wafers 21 located on the pallet become electrically part of the anode 19. After loading the wafers 21 into the apparatus 11, a low pressure gaseous ion source is introduced through an inlet port 26 shown in the base 13. A preferred ion source is argon gas which is typically used in the chamber 14 at an absolute pressure of $10^{-2}$ torr. The argon is ionized by an electron flow from the target 18 to the anode 19. In addition to the field potential, an alternating potential at radio frequencies may be superimposed onto the existing field potential. In the described embodiment a 3KW power supply 28 working at a frequency of 13.56 megahertz is preferred.

The polarity of the power supply 28 in FIG. 1 is applicable to a typical process for depositing a film of material on the wafers 21, as described hereinafter. It should be realized, however, that by reversing the polarity of the potential on the power supply 28, the process can be reversed in that the target 18 becomes the anode 19 and the wafers 21 on the pallet 23 become part of the cathode. The resulting reverse sputtering process is then also referred to as a sputter-etch process. It should be realized, however, that such a reversal of the process is possible only where the workpieces are part of the anode during the normal sputter deposition mode. Thus, in general, the target 18 and the pallet 23 are electrodes which, depending on the direction or polarity of the applied electric field, become a cathode or an anode.

Electrons discharging and flowing as a result of the applied potential from the target 18 to the anode 19 collide in their path with atoms of the introduced gas thereby ionizing the atoms. The ions are attracted toward the target 18, and in striking the target 18, they erode material from the target. The eroded material leaves the target 18. Some of the eroded material deposits on the pallet 23 and on the wafers 21 located thereon. The pallet 23 is positioned in parallel to the target 18 to afford the wafers 21 an optimum exposure angle to the material eroding from the target 18. The features of the sputtering apparatus 11 described thus far pertain mostly to those which are found in prior art apparatus. However, by improving the prior art sputtering method and apparatus in accordance with the present invention, the uniformity of material deposition over the entire area of the pallet 23 can be significantly enhanced.

2. Improving the Uniformity of Material Deposition

Referring now to FIGS. 1 and 2, a specific embodiment of the present invention has two bar magnets 31 and 32 positioned with their longitudinal axes in a plane parallel to the target 18 and the anode 19. The magnetic field associated with each of the magnets 31 and 32 extends with decreasing strength into a respective peripheral segment or domain 33 of the space between the target 18 and the anode 19. Centrally between the target 18 and the anode, the magnetic field runs substantially lateral or parallel to the target 18 and the anode 19. This is particularly advantageous since the influence of the magnetic field on the electrons is maximized when the magnetic field lies perpendicular to the electron flow.

Also, referring to FIG. 2, it can be seen that the field is strongest in portions of the domains 33 between the target and the anode which lie toward the periphery of the pallet 23 and decrease in strength toward the center of the pallet.

To the extent that the magnetic flux lines do not extend in the same direction as the current flow between the target 18 and the anode 19, the magnetic field superimposes a rotational path onto a theoretically straight line electron flow between the target 18 and the anode 19. Such a superimposed path is believed to result in a swirling motion which increases the path lengths of the electrons between the target 18 and the anode 19. Consequently, the charge density in the space between the target 18 and the anode 19 is increased. The increased electron activity in the space between the target 18 and the anode 19 results in a greater ion generation and consequently in a greater sputtering erosion of the target 18 in those areas of the target adjacent the domain 33.

The direction of the magnetic flux lines substantially parallel to the target 18 and the pallet 19 has consequently been found to have a significant impact on sputtering to and from the respective adjacent areas. However, the placement of north and south poles of the magnets 31 and 32 to one end or the other did not affect the results of sputtering operations to any measurable extent. Therefore, in positioning the magnets 31 and 32 as shown in FIG. 2, no particular position for the respective north or south poles is preferred over any other. Magnetic interactions between the magnets 31 and 32 appeared to be negligible because of the spacing between the two magnets.

In the top view of the apparatus 11 of FIG. 2, the target 18 is shown in phantom lines to afford a top view of the anode 19 with the pallet 23 showing the wafers 21 positioned for a single batch sputtering operation. It is to be noted that the outermost configuration of wafers 21, while located on only approximately 40% of the radius of the pallet 23 includes over 60% of all the wafers 21 on the pallet 23. Consequently, a relatively large number of wafers 21 are affected by changes in the sputtering activity along the periphery of the pallet 23. For instance, a substantial tapering off of material deposition near the outer perimeter of the pallet 23 significantly decreases the number of wafers which can be processed in a single batch.

The graphical illustration of FIG. 3 represents material deposition thicknesses as measured in angstroms, the variations of which directly correspond to deposition rates at measured distances (in inches) from the centerline of the anode or pallet 23. Graph 36 represents a deposited thickness distribution of material on the pallet 23 as deposited in accordance with the prior art. The graph 36 illustrates a substantial uniformity over a major portion of the a pallet 23. A slight decrease of deposition at the very center of the pallet 23 is characteristic for relatively close cathode to anode spacings. Such a slight decrease, which may possibly be the result of partial ion depletion near the center of the cathode, does not affect the present invention. However, the thickness of the deposited material decreases significantly toward the outer edges or the periphery of the pallet, as indicated by the lefthand side of the graph 36. This peripheral decrease in the depositing material takes place despite an approximate 17% reduction of the diameter of the pallet 23 below that of the target 18.

The apparatus 11 in accordance with the present invention results in a significant increase of deposited material in the peripheral area of the pallet 23 adjacent the domain 33. Graph 37 represents material deposition recorded along a line 41 between the outer periphery and the center of the pallet in the presence of the magnet 31 positioned 5¼ inch from the cenerline 42 of the apparatus. The material deposition measured along the line 41 was generated without rotation of the pallet 23 about the central axis of the anode 19. The result in graph 37 shows a substantial increase in material deposition along the periphery of the pallet 23. It should be noted, however, that this increase is nonuniform with respect to the periphery of the pallet 23. Without rotation of the pallet 23 about its central axis, material deposition increased only in the area of the pallet 23 which borders the domain 33 of the magnetic field. For instance, along a line 43 perpendicular to the line 41 and through the center of the pallet, the influence of the magnets 31 and 32 to cause an increase of material deposition near the periphery of the pallet 23 is substantially negligible.

Referring to graph 38, the peripheral increase of material deposition becomes distributed substantially evenly about the periphery of the pallet 23 by a uniform rotation of the pallet 23 throughout the sputtering operation. The distributed increase of deposited material superimposed on or added to the material as deposited in accordance with the prior art results in a substantially more uniform distribution of deposited material over the entire surface of the pallet 23. Rotation of the pallet 23 as it results from a rotation of the anode 19 exposes each peripheral area of the pallet 23 to the domain 33 of increased sputtering twice during each revolution of such an area. Assuming the number of revolutions of the pallet about its central axis 42 to be an even number during the sputtering process, it can be seen that all peripheral areas of the pallet 23 are exposed equally to the increased sputtering resulting from the presence of the magnetic fields of the magnets 31 and 32. With an increasing number of revolutions of the pallet 23 during a given sputtering operation, a partial revolution at the end of the operation takes on less significance in affecting the uniformity of the deposited film thicknesses. It should therefore be recognized that while an even number of revolutions of the pallet 23 during a sputtering operation are desirable, they are not essential to an effective implementation of the present invention.

In addition to the rotation of the pallet 23, other factors affect the uniformity of the films in relation to the various wafer positions on the pallet 23. One factor affecting the uniformity is the field strength of each of the magnets 31 and 32. An increased field strength has an increased effect on the density of the electrons in the respective domains 33. Another factor determining the film uniformity is the location of each of the magnets in relation to the central axis 42 of the apparatus. In reference to FIG. 2, varying the location of the magnet by increasing or decreasing a distance $a$, appears to have a similar effect as a change in the field strength of the respective magnets 31 or 32.

3. Example

In optimizing the film uniformity, tests were conducted on the apparatus 11 with the following size parameters. The magnets 31 and 32, each having been selected 8 inches in length and 1 × ¾inches in cross section, were arranged in relation to the existing target 18 and anode 19. The target 18 was 12 inches in diameter, and the diameter of the pallet 23 was 10 inches. With a preferred spacing of 1.75 inches between the target 18 and the wafers 21 on the pallet 23, the magnets 31 and 32 were adjusted outwardly from the centerline until the distance $a$ was approximately 7.25 inches. With the magnets having a field strength of 650 oersteds the uniformity of the deposited films resulted in an approximately 3% variation between the 19 2-inch wafers on the pallet 23. The approximate radial variation in the uniformity of the films is illustrated by the graph 39 in FIG. 3.

In the described embodiment, the magnets 31 and 32 were located with a lower surface 47 of the magnets 31 and 32 on approximately the same elevation as the wafers 21. Supporting shelves 48 were attached to other internal supporting structure elements 51. It should be noted here that all of the structural elements 51 as well as the shelves 48 were, typically for the type of apparatus 11, constructed of nonmagnetic materials. In general, the vertical position of the magnets 31 and 32 is believed to be at an optimum when the direction of the magnetic field in the domain 33 extends generally perpendicularly to the direction of the electric field between the target 18 and the anode 19.

4. Alternate Embodiments

Within the scope and spirit of the present invention various changes and modifications of the described embodiment are possible. For example, it must be realized that the rotation of the anode 19 with respect to the target 18 also results in a relative motion with respect to the stationarymagnets 31 and 32, and particularly with respect to the magnetic field associated with the magnets. Where the sputtering apparatus does not lend itself to be equipped with a rotating workholder such as the pallet 23, relative motion between the domain 33 of increased charge density and the adjacent areas of the pallet 23 and of the target 18 can be achieved by other means. It is, therefore, within the scope of this invention to rotate the peripheral magnetic field about the central axis 42 of the apparatus 11. Such a rotation can be implemented by an actual revolving movement of at least one magnet such as the magnets 31 and 32 about the central axis 42.

Also, since the magnets 31 and 32 are merely a means for generating the field in the peripheral domain 33, the magnets need not be permanent magnets but can be electromagnets to induce the desired field. An arrangement of electromagnets has additional advantages related to directing the desired magnetic field perpendicularly through the peripheral domain of the electric field between the cathode and the anode of the apparatus 11 and in relative motion with respect to the workholder. For instance, a plurality of electromagnets positioned horizontally adjacent the periphery of the pallet 23 can be selectively activated to generate a circulating domain 33 of magnetic flux lines interacting in substantially perpendicular relationship with the electric field between the cathode and the anode. If such an electrically activated domain 33 moves or circulates adjacent the periphery of the pallet 23, a result is obtained which similarly to the described embodiment of the invention tends to overcome peripheral effects of decreased material deposition. One advantage of moving the magnetic field with respect to the stationary target 18 and pallet 23 is that the nonuniform erosion of the target caused by the magnetic field is also distributed about the periphery of the target without other provisions for rotating the target 18 being required.

In addition, the selectively activated or switched magnetic field combines the advantageous orientation of the flux lines substantially perpendicular to the electric field in the peripheral domain with the advantage of not having physically moving parts. Because of the high vacuum requirements within the chamber 14, elimination of the need for movable or rotatable parts is desirable for some types of commercially available apparatus 11.

Various other changes and modification of the described apparatus are possible within the scope and spirit of this invention. The invention is intended to be limited only by the scope of the claims appended hereto.

What is claimed is:

1. A method of sputtering in an evacuable chamber between a substantially circular cathode and a substantially circular anode each being parallel to, and mutually spaced from the other, the anode including a workholder facing the cathode, the workholder being rotatably mounted with respect to a longitudinal axis through the cathode and the anode, the method including causing an electron flow from the cathode to the anode, the electron flow resulting in the generation of ions from a gaseous source in a partially evacuated space between the cathode and the anode, bombarding of the cathode with the ions resulting in erosion of material from the cathode and deposition of at least some of the material on workpieces located on the workholder at the anode, wherein the improvement comprises:

maintaining a magnetic field within the chamber, the field being associated with at least one permanent magnet, the magnet being located within the chamber centered in a plane parallel to and between the planes of the anode and the cathode, and positioned outside of the space between the anode and the cathode, a portion of said magnetic field passing substantially laterally through at least one peripheral segment of the space between the cathode and the anode and decreasing in strength in a radially inward direction toward the longitudinal axis through the cathode and the anode, the magnetic field increasing the length of the path of the electrons to increase the generation of ions in the space of the peripheral segment of the magnetic field between the cathode and the anode, the increased ion generation resulting in an increased material deposition rate on workpieces located within the segment with respect to workpieces located adjacent such segment; and rotating the workholder about the longitudinal axis, and exposing all workpieces located near the periphery of the workholder to such increases in the material deposition rate as the workholder moves the workpieces through the segment of the increased ion generation.

2. Apparatus for sputtering a material from a first surface to coat workpieces located on a second surface which comprises:

a substantially circular cathode having the first surface located thereon;

a substantially circular anode having the second surface located thereon, the second surface being parallel to and spaced from the first surface;

means for locating workpieces on the second surface of the anode;

an enclosure surrounding the cathode and the anode to form an evacuable chamber thereabout;

means for evacuating the chamber;

means for introducing an ionizable gaseous substance into the space between the cathode and the anode;

means for applying an electrical potential across the anode and the cathode;

at least one permanent magnet located within the chamber centered in a plane parallel to and between planes wherein the anode and the cathode are located, the magnet being positioned outside of the space between the cathode and the anode, for generating at least one lateral magnetic field, the field extending substantially parallel to the first and second surfaces of the cathode and of the anode into at least one peripheral segment of the space between the cathode and the anode, the field having a decreasing strength in a direction toward the center of the anode throughout a major portion of the segment; and means for rotating the anode with respect to the cathode and the peripheral segment about a central longitudinal axis through the cathode and the anode, thereby exposing the workpieces located near the periphery of the anode equally to the increased magnetic field in the space between the cathode and the anode, and to a correspondingly increased sputter deposition of material on such workpieces.

3. Apparatus according to claim 2, wherein at least one permanent magnet comprises two bar magnets, each being parallel to a plane through an axis perpendicular to the first and the second surfaces, each magnet being spaced from such plane by a predetermined distance.

* * * * *